United States Patent [19]

Dahlin

[11] Patent Number: 5,689,106

[45] Date of Patent: Nov. 18, 1997

[54] OPTICAL DEVICE ASSEMBLY HAVING A METALLIC BUMP BONDING TOGETHER TWO PLANAR OPTICAL COMPONENTS, AND ITS PREPARATION

[75] Inventor: Michael J. Dahlin, Santa Barbara, Calif.

[73] Assignee: Santa Barbara Research Center, Goleta, Calif.

[21] Appl. No.: 361,622

[22] Filed: Dec. 22, 1994

[51] Int. Cl.⁶ .................................................... G01J 3/50
[52] U.S. Cl. ............................ 250/226; 257/433; 359/66
[58] Field of Search ................................. 250/226, 216, 250/239, 214.1, 551, 208.1; 257/432, 433, 81, 99, 737; 359/66–69

[56] References Cited

U.S. PATENT DOCUMENTS

| | | | |
|---|---|---|---|
| 4,636,631 | 1/1987 | Carpentier et al. | 250/216 |
| 4,695,719 | 9/1987 | Wilwerding | 250/239 |
| 5,289,002 | 2/1994 | Tam | 250/239 |
| 5,336,547 | 8/1994 | Kawakita et al. | 257/737 |
| 5,380,669 | 1/1995 | Norton | 250/372 |
| 5,436,492 | 7/1995 | Yamanaka | 257/433 |
| 5,506,401 | 4/1996 | Segawa et al. | 250/208.1 |

*Primary Examiner*—Que Le
*Attorney, Agent, or Firm*—W. C. Schubert; W. K. Denson-Low

[57] ABSTRACT

An optical device assembly includes a planar optical filter and a planar sensor having an optically active area. The optical filter and the sensor are joined together with a gap therebetween by a metallic bump extending between the optical filter and the sensor. The metallic bump, which is preferably indium, is positioned at a location outside of the optically active area of the planar sensor. The metallic bump is preferably formed by vapor depositing an indium subbump on the optical filter and another indium subbump on the planar sensor, in each case outside of their optically active areas, and thereafter pressing the two subbumps together to complete the bonding.

19 Claims, 2 Drawing Sheets

OPTICAL DEVICE ASSEMBLY HAVING A METALLIC BUMP BONDING TOGETHER TWO PLANAR OPTICAL COMPONENTS, AND ITS PREPARATION

BACKGROUND OF THE INVENTION

This invention relates to the assembly of optical components into a device, and, more particularly, to such a device in which components are precisely positioned and joined together in a parallel, spaced-apart relationship.

The fabrication of optical devices sometimes requires that certain substantially planar optical components be joined together to each other in a parallel arrangement. As an example, in one type of sensor, a planar optical filter is positioned adjacent and parallel to a planar sensor chip. The two components are separately fabricated and assembled in this arrangement. In operation of the final device, light passes through the filter to reach the sensor.

In the conventional assembly approach, a thin layer of a curable, transparent adhesive such as an epoxy is placed between the two components. The components are pressed together with the aid of appropriate tooling to a desired spacing prior to curing of the adhesive. After curing, the components are permanently bonded together with the layer of adhesive.

While operable, this fabrication technique has drawbacks. The adhesive bonding approach has relatively loose assembly tolerances in both the direction lying in the plane of the components and in the spacing between the components. The assembly time is relatively long, on the order of 12 hours, due to the need to at least partially cure the adhesive in the tooling. In operation of the device, the light reaching the sensor must pass through the adhesive layer, which attenuates and possibly distorts the light. The contact of the cured adhesive to the faces of the optical components can adversely affect their service lives.

Thus, there is a need for an improved approach for assembling such proximal filter/sensor devices, and other types of devices having the same requirements. The present invention fulfills this need, and further provides related advantages.

SUMMARY OF THE INVENTION

The present invention provides an optical device assembly and a method for its preparation. The present approach provides a device in which the in-plane and perpendicular component tolerances are significantly smaller than those for the adhesive bonding approach. Assembly time is short, on the order of 1 hour, thereby reducing the cost of the product. There is no adhesive or other foreign material touching the faces of the components or lying between the components, so that long-term degradation is reduced and there is no obstacle in the optical path of the device resulting from the presence of foreign material. The present invention thus achieves both reduced cost and improved electro-optical performance of the device.

In accordance with the invention, an optical device assembly comprises a planar first optical component, preferably a planar optical filter, and a planar second optical component, preferably a planar sensor, having an optically active area. The first optical component is positioned in a facing relationship to the second optical component with a gap therebetween. A metallic bump, preferably made of indium and having a height of at least about 60 micrometers, extends between the first optical component and the second optical component and bonds the first optical component and the second optical component together. The metallic bump contacts the second optical component at a location outside of its optically active area. If desired, the bonding provided by the metallic bump can be supplemented by a reinforcement of a curable adhesive or other material, positioned adjacent to the metallic bump and outside of the active area of the second optical component.

The metallic bump is preferably formed by depositing a metallic first subbump on the first optical component and a metallic second subbump on the second optical component. The bonding between the two components is completed by bonding the first metallic subbump to the second metallic subbump, to form the single metallic bump. Alternatively and less desirably, the entire metallic bump can be deposited on one of the components and then bonded to the other component.

The approach of the invention provides an advance in the art of fabrication and assembly of optical devices in which two components in an optical train must be bonded together. The assembly cost is reduced due to a reduction in the bonding time. Tolerances are improved due to the stability of a metal bonding element as compared with a cured adhesive, which can distort as it cures. Optical performance is improved because no adhesive lies in the optical path, and the components are separated only by a gap. Long-term stability of the device is improved because no adhesive touches the faces of either of the components.

Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
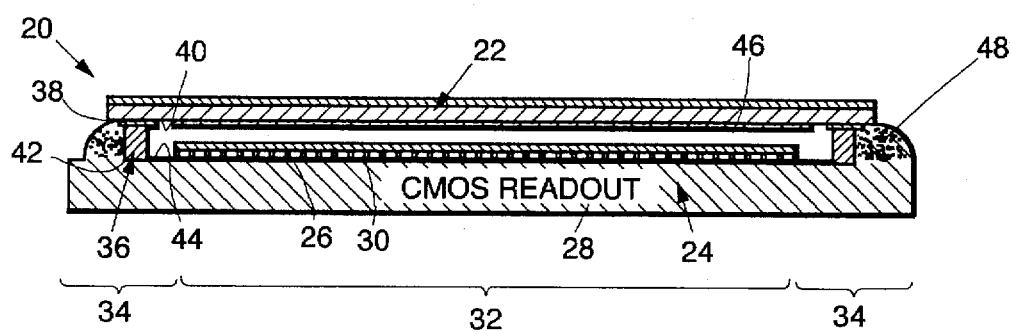
FIG. 1 is a schematic sectional view of an optical device assembly fabricated according to the approach of the invention.

FIG. 1 depicts an optical device 20 prepared by the present approach. The optical device 20 includes a first optical component 22 and a second optical component 24. The optical components 22 and 24 are planar in form. As used herein, "planar" means that the device has a greater lateral (x-y) extent than thickness (z), and that there is a dominant plane defined by the x-y directions to which most of the features of the component are parallel. There may be some non-planar features, but the component is predominantly planar.

In the presently preferred case, the first optical component 22 is a proximal optical filter formed of a substrate which can have various types of thin film coatings deposited thereon to serve particular optical filtering functions. The second optical component 24 is preferably a sensor that detects and reads out the intensity of the light that passes through the first optical component 22 and reaches the second optical component 24. In the presently preferred case, the second optical component 24 comprises a detector layer 26 of indium antimonide (InSb) coated with an anti-reflective coating that detects incident light by converting it to an electrical signal. A readout layer 28 lies below but adjacent to the detector layer 26 and comprises a CMOS material which senses the electrical voltage. The readout layer 28 is electrically connected to the detector layer 26 by an indium/epoxy interconnect 30. The individual structures and fabrication of these components are well known in the art, and are described in R. M. Hoendervooght, K. A. Kormos, J. P. Rosbeck, J. R. Toman, and C. B. Burgett, "Hybrid InSb Focal Plane Array Fabrication", *IEDM Tech. Dig.*, page 510 (1978). The first optical component 22 and second optical component 24 preferably have the described structures because that is the principal interest of the inventor. However, the invention is not limited to this preferred case, and can be used more generally.

A characteristic of the second optical component is that it has an optically active area 32, normally in the center of the component, with the remainder of the surface being an optically inactive area 34. That is, the optically active area 32 has both the detector and readout structure to enable it to function for its intended light sensing purpose, and is aligned with an operable region of the first optical component 22. The optically inactive area 34 is usually found, as depicted, at the edges of the component and is optically inactive because at least some of the structure required for the optical functioning is absent or because it is not aligned with an operable area of the first optical component 22. The optically inactive area 34 is available for use for interconnect, support, and other subsidiary but necessary functions. The distinction between the optically active area 32 and the optically inactive area 34 is important because any joining structure placed into the optically active area 32 potentially interferes with the functioning of the device.

The first optical component 22 and the second optical component 24 are separately fabricated and joined by a joining means. The joining means includes a metallic bump 36 or column extending between the first optical component 22 and the second optical component 24. The metallic bump 36 is positioned outside the optically active area 32, in the optically inactive area 34 of the second optical component 24. There is a first bond 38 between the metallic bump 36 and a first face 40 of the first optical device 22, and a second bond 42 between the metallic bump 36 and a second face 44 of the second optical device 24.

The metallic bump 36 is preferably made of indium, so that the first bond 38 and the second bond 42 can be cold-weld bonded to the optical devices 22 and 24. That is, the bonds 38 and 42 can be formed by the application of pressure at ambient temperature, while simultaneously the indium metal deforms to the desired height. The metallic bump 36 is preferably at least about 60 micrometers high in its final form. The metallic bump 36 can have any operable shape and form. In the sectional view of FIG. 1, the metallic bump 36 is depicted as a regular column, but it may be bowed, slanted, or otherwise irregular in shape, as long as the bonds 38 and 42 are formed and the metallic bump has mechanical strength to bond the components 22 and 24 together. When viewed perpendicular to the plane of the components 22 and 24, the metallic bump 36 can be a series of dots, an elongated strip or bead, or other operable form.

Figure 2:
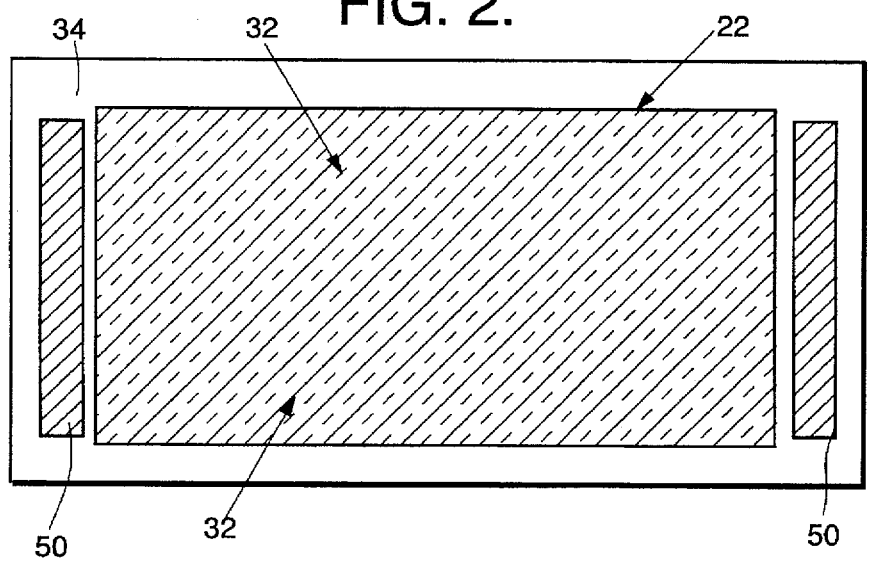
FIG. 2 is a bottom view of the first optical component.
Figure 3:
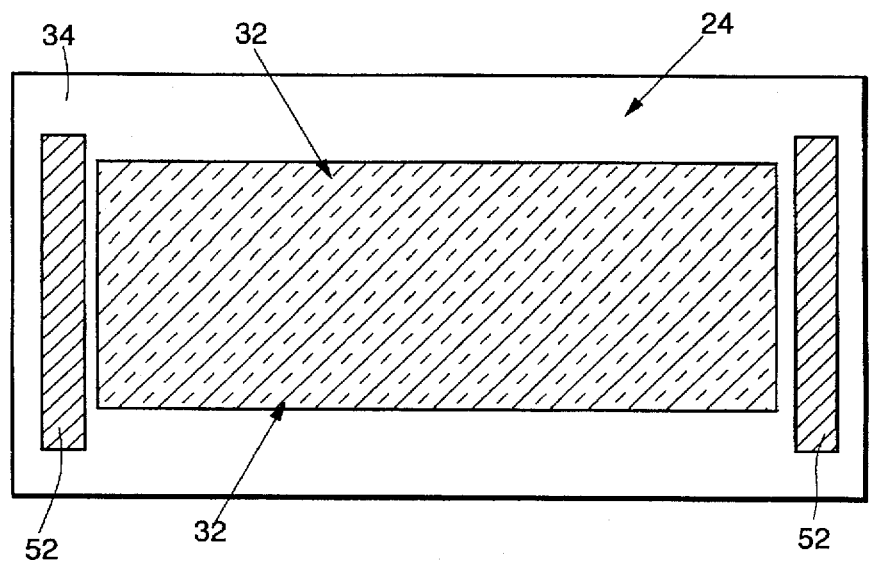
FIG. 3 is a top view of the second optical component.
Figure 4:
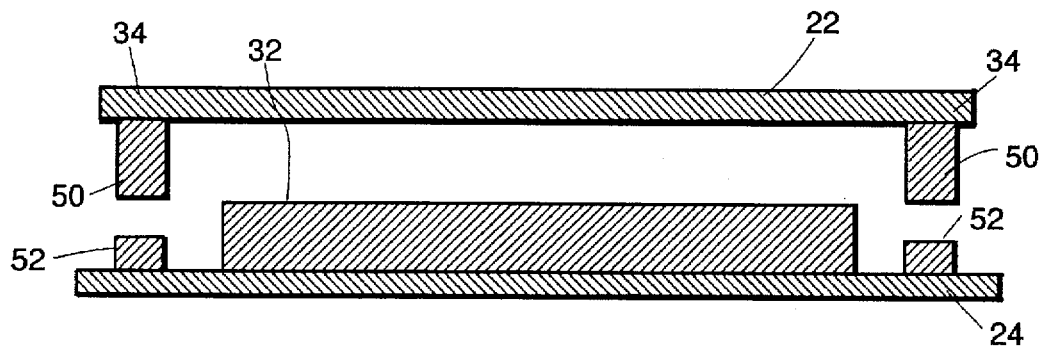
FIG. 4 is a schematic sectional view of the optical device assembly of FIG. 1, prior to final assembly.
Figure 5:
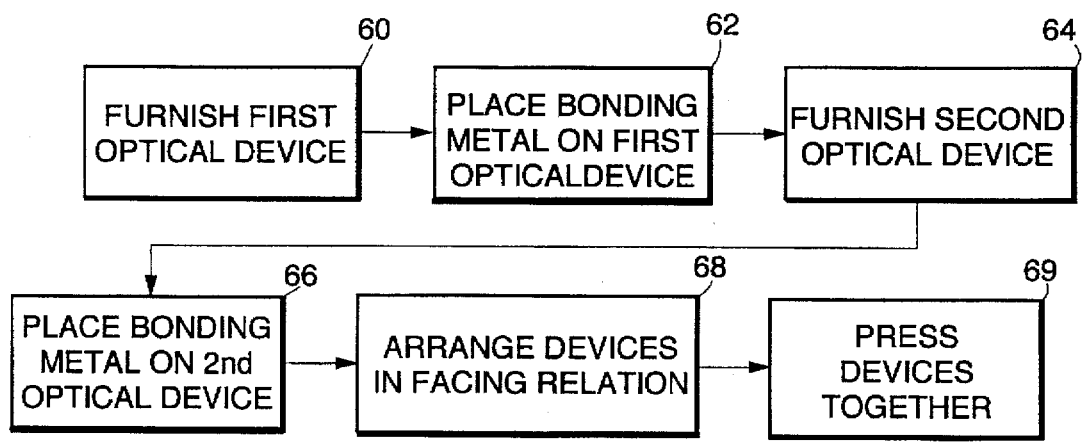
FIG. 5 is a process flow diagram for the approach of the invention.

FIGS. 2–4 depict the components used in the fabrication of the device 20 prior to final assembly, and FIG. 5 depicts the preferred method of practicing the invention. The first optical component 22 is furnished, numeral 60. A metallic mass of the material used to form the bump 36 is placed upon the optically inactive area 32 of the first optical component 22, forming a first subbump 50, numeral 62. In this preferred case, the first subbump 50 is in the form of two parallel strips on the opposing inactive areas 34, see FIG. 2. For the case of the preferred indium metal, the first subbump 50 is deposited by vapor deposition. The first subbump 50 can be of any operable height, but in the preferred case the first subbump 50 is about 56 micrometers high.

The second optical component 24 is furnished, numeral 64. A metallic mass of the material used to form the bump 36 is placed upon the optically inactive areas of the second optical component 24, forming a second subbump 52, numeral 66. The second subbump 52 is in the form of two parallel strips spaced apart the same distance as the first subbumps 50, see FIG. 3. For the preferred case, the second subbump 52 is deposited by vapor deposition. The second subbump 52 can be of any operable height, but in the preferred embodiment is about 6 micrometers high.

The components 22 and 24 are carefully arranged in a facing relationship with the strips of the subbumps 50 and 52 aligned, as shown in FIG. 4, numeral 68, and with the components 22 and 24 in a spaced apart relation. The precise positioning of the components 22 and 24 relative to each other, both in the lateral and spacing directions, is normally aided by the use of appropriate tooling and inspection.

The subbumps 50 and 52 are thereafter pressed together, numeral 69, to bond together, thereby forming the single bump 36. Indium has the property that it can be readily cold welded to itself at ambient temperature under moderate pressures, and for this reason is preferred as material of the metallic bump. The applied pressure is preferably about 40 pounds at the bonded region to accomplish the cold welding.

During the pressing step 69, the metallic bump material deforms compressively under the applied pressure. In the preferred case, the deformation is such that the final height of the bump 36, formed by bonding together the 56-micrometer high subbump 50 and the 6-micrometer high subbump 52, is about 60 micrometers. As the bump material deforms to its final thickness, the spacing between the components 22 and 24 is reduced, until it reaches a final spacing with a gap 46 between the components 22 and 24, see FIG. 1. In the presently preferred application, the gap 46 defines a final spacing of about 10 micrometers between the optically active areas of the components 22 and 24.

Optionally, the bonding produced by the metallic bump 36 between the components 22 and 24 can be supplemented by another bonding agent. FIG. 1 shows a adhesive bonding mass 48 of a curable adhesive such as an epoxy positioned adjacent to the metallic bump 36 and extending between the components 22 and 24 and bonding them together. The adhesive bonding mass 48 is, like the metallic bump 36, located outside the optically active area 32. The adhesive bonding mass can be of any operable material. As shown in FIG. 1, when it is used the bonding mass 48 is preferably filleted against the outwardly facing side of the metallic bump 36. The bonding mass 48 can be of any operable form and shape, such as a series of dots, a bead, or the like. If used, the adhesive bonding mass is applied in a further step conducted in a step subsequent to the pressing step 69 and thereafter cured. Application is typically accomplished by extrusion through a needle. If used, the adhesive bonding mass provides secondary bonding strength, but the primary bonding of the components 22 and 24 is accomplished by the metallic bump 36.

Figure 6:
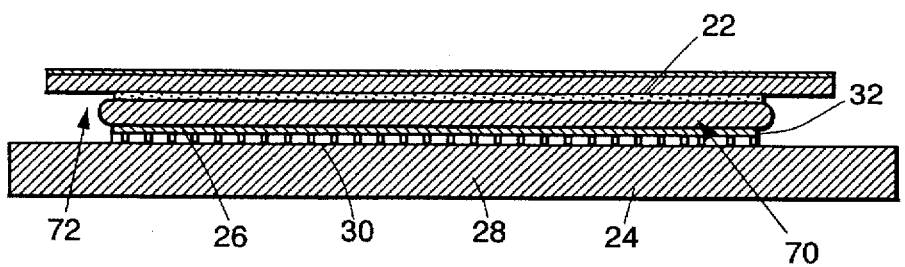
FIG. 6 is a sectional view of an optical device assembly fabricated according to the prior approach.

The approach of the present invention may be contrasted with the prior approach by comparing FIG. 1, the present approach, and FIG. 6, the prior approach. In FIG. 6, the same components 22 and 24 are used, except that no subbumps are formed. In joining the components 22 and 24 together, a mass 70 of a curable adhesive such as an epoxy is placed between the components 22 and 24. The mass 70 covers all or a major portion of the optically active area 32 of the second component 24. The components are pressed together to adjust their spacing to the desired value, and the mass is cured in place. No bonding structure is present in a peripheral region 72.

The present approach accomplishes the assembly and bonding using the metallic bump in less than one hour, while the prior approach requires 12 hours of curing with the spacing and positioning of the components maintained as precisely as possible. Even then, with the prior approach the best lateral (x-y) tolerance that can be achieved is ±25 to 250 micrometers and the best spacing tolerance that can be achieved is ±10 micrometers, due to the dimensional changes inherent in the curing of the adhesive and the large coefficient of thermal expansion of the adhesive. With the present approach, a lateral tolerance of ±10 micrometers and a spacing tolerance of less than 2 micrometers are achieved because, once deformed and bonded, the metallic bump changes dimensions very little.

The present approach also places no foreign matter such as bonding material in contact with the active layers of the components. By contrast, the region 70 of the prior approach places the adhesive across the entire facing surfaces of the two components. It is known that such contact of a foreign substance can lead to long-term degradation in the performance of the components due to stresses and other factors. Lastly, the presence of a foreign material in the region 70 can spectrally absorb and reflect the light as it travels to the second component, inasmuch as it is in the optical path of the device. No such interference is present in the device of the invention. The gap 46 can be filled with air or vacuum, if the entire device is operated within an evacuated space.

The present invention has been tested on a simulated optical device. The first optical component was simulated by a structure of a silicon substrate and BK-7 glass. The second optical component was simulated by a silicon substrate. Bonding was successfully accomplished according to the procedure set forth hereinabove.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. An optical device assembly, comprising:
   a planar optical filter having a first face;
   a planar sensor having a second face and an optically active area;
   means for joining the optical filter to the sensor with a gap therebetween, the means for joining comprising
     a cold-weldable metallic bump extending between the first face of the optical filter and the second face of the sensor,
     a first bond between the metallic bump and the first face of the optical filter, and
     a second bond between the metallic bump and the second face of the sensor, the second bond being at a location outside of the optically active area of the planar sensor.

2. The assembly of claim 1, wherein the metallic bump is made of indium.

3. The assembly of claim 1, wherein the metallic bump has a height of at least about 60 micrometers.

4. The assembly of claim 1, wherein the metallic bump comprises
   a first subbump on the planar optical filter, and
   a second subbump on the planar sensor, the first subbump being cold-weld bonded to the second subbump.

5. The assembly of claim 1, wherein the planar sensor comprises
   a readout layer,
   a detector layer, and
   an electrical interconnect between the readout layer and the detector layer, the second face of the sensor being on the readout layer and the gap lying between the detector layer and the first face of the optical filter.

6. The assembly of claim 1, wherein the planar sensor comprises
   a readout layer,
   a detector layer, and
   an electrical interconnect between the readout layer and the detector layer, and wherein the means for joining further includes
   a reinforcement lying adjacent to the metallic bump but not between the detector layer and the optical filter.

7. The assembly of claim 1, further including
   a reinforcement lying adjacent to the metallic bump, the reinforcement contacting the planar sensor outside of its optically active area.

8. The assembly of claim 7, wherein the reinforcement is a mass of a curable adhesive.

9. An optical device assembly, comprising:
   a planar first optical component;
   a planar second optical component having an optically active area, the first optical component being positioned in a facing relationship to the second optical component with a gap therebetween; and
   a cold-weldable metallic bump extending between the first optical component and the second optical component and bonding the first optical component and the second optical component together, the metallic bump contacting the second optical component at a location outside of its optically active area.

10. The assembly of claim 9, wherein the first optical component is a filter and the second optical component is a sensor.

11. The assembly of claim 9, wherein the metallic bump is made of indium.

12. The assembly of claim 9, wherein the metallic bump has a height of at least about 60 micrometers.

13. The assembly of claim 9, further including
    a reinforcement lying adjacent to the metallic bump, the reinforcement contacting the second optical component outside of its optically active area.

14. The assembly of claim 13, wherein the reinforcement is a mass of a curable adhesive.

15. A method for preparing an optical device assembly, comprising the steps of:
    furnishing a planar first optical component having a first optically active area;
    furnishing a planar second optical component having a second optically active area;
    depositing a first subbump on the first optical component outside of the first optically active area;

depositing a second subbump on the second optical component outside of the second optically active area;

arranging the two optical components in a generally facing relationship with the first subbump and the second subbump aligned and in a facing relationship; and pressing the first optical component toward the second optical component to cause the first subbump and the second subbump to weld together, forming a bump therebetween.

16. The method of claim 15, wherein the step of arranging includes the step of positioning tooling between the first optical component and the second optical component to define a final spacing therebetween, and wherein the step of pressing includes the step of continuing the pressing until the optical components are separated by the final spacing.

17. The method of claim 15, wherein the step of depositing the first subbump includes the step of depositing indium metal as the material of the first subbump.

18. The method of claim 15, wherein the step of depositing the second subbump includes the step of depositing indium metal as the material of the second subbump.

19. An optical device assembly prepared by the method of claim 15.

* * * * *